United States Patent [19]

Langheinrich et al.

[11] 3,998,675
[45] Dec. 21, 1976

[54] METHOD OF DOPING A SEMICONDUCTOR BODY

[75] Inventors: Werner Langheinrich, Ulm, Donau; Max Kuisl; Anton Sturmer, both of Neu-Ulm; Friedrich Lammel, Ulm (Danube), all of Germany

[73] Assignee: Licentia Patent-Verwaltungs-G.m.b.H., Frankfurt am Main, Germany

[22] Filed: Nov. 11, 1975

[21] Appl. No.: 630,891

[30] Foreign Application Priority Data

Nov. 16, 1974 Germany .......................... 2454412

[52] U.S. Cl. ............................ 148/189; 148/186; 148/187; 252/62.3 E
[51] Int. Cl.$^2$ ..................................... H01L 21/223
[58] Field of Search ................. 148/186, 189, 187; 252/62.3 E

[56] References Cited

UNITED STATES PATENTS

| | | | |
|---|---|---|---|
| 3,313,663 | 4/1967 | Yeh et al. ........................... | 148/187 |
| 3,542,609 | 11/1970 | Bohne et al. ....................... | 148/188 |
| 3,566,517 | 3/1971 | Brown et al. ....................... | 29/571 |
| 3,615,936 | 10/1971 | Batz ............................... | 148/189 X |

*Primary Examiner*—G. Ozaki
*Attorney, Agent, or Firm*—Spencer & Kaye

[57] ABSTRACT

A method of doping a semiconductor body comprises applying to a surface of the semiconductor body a layer through which the doping material can diffuse and provide the layer with a reducing agent to reduce the doping material to its elemental form at areas where doping is not required.

11 Claims, 1 Drawing Figure

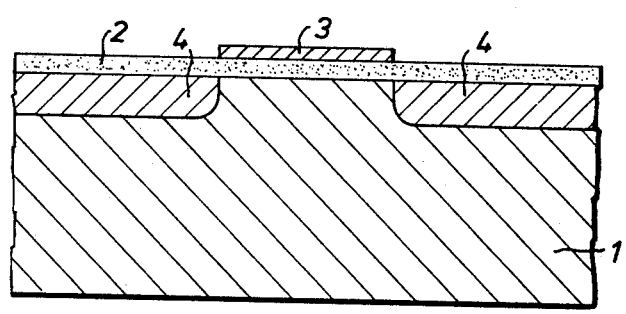

METHOD OF DOPING A SEMICONDUCTOR BODY

BACKGROUND OF THE INVENTION

The invention relates to a method of doping a semiconductor body by diffusion from the gaseous phase in which centres of impurity are diffused into a limited area of one surface of a semiconductor body.

Such a method finds application, as known, in planar technology. Usually, silicon dioxide is used as a diffusion mask which can arrest the oxides of doping materials for a certain time so that they do not come into contact with the semiconductor body. However, it is desirable, in many cases, either to be able to diffuse for longer periods or to be able use thinner diffusion masks.

SUMMARY OF THE INVENTION

It is an object of the invention to provide a method of diffusion which either enables a longer diffusion time or the use of thinner diffusion masks.

According to a first aspect of the invention, there is provided a method of doping a semiconductor body by diffusion from the gaseous phase in which centres of impurity are diffused into a limited region of one side of the surface of a semiconductor body, characterized by coating the surface over its entire area with a layer through which the doping material is capable of diffusing; and providing this layer with a reducing agent at those points at which doping is not desired in the semiconductor body, said reducing agent reducing the doping material from its form in the gaseous atmosphere to the elemental form.

According to a second aspect of the invention, there is provided a method of doping a semiconductor body comprising the steps of coating a surface of said semiconductor body over its entire area with a layer through which doping material can diffuse, providing said layer with a reducing agent at those parts of said surface of said semiconductor at which doping is not required for reducing the doping material to its elemental form and applying a gaseous phase of the doping material to said surface of said semiconductor body.

BRIEF DESCRIPTION OF THE DRAWING

The invention will now be described in greater detail, by way of example, with reference to the drawing, the single FIGURE of which shows digrammatically a section through a semiconductor body doped in accordance with the method of the invention.

DESCRIPTION OF THE PREFERRED EMBODIMENT

Basically, the invention proposes, in a method of doping a semiconductor body by diffusion from the gaseous phase in which centres of impurity are diffused into a limited area of one surface of a semiconductor body, that this surface should be coated over its entire area with a layer through which the doping material is capable of diffusing and that this layer is provided with a reducing agent at those points at which doping is not desired into the semiconductor body, the agent reducing the doping material which arrives from the gaseous atmosphere, to the element.

The reducing agent is either contained in the layer or is applied to it. For example, an oxide or a nitride is used as a layer material. The layer located on the semiconductor body is, for example, an insulating layer. For example, a metal or a semiconductor can be used as a reducing agent. When using $SiO_2$ as a layer, silicon, for example, may be used as a reducing agent and oxides of phosphorus or the element phosphorus may be used as doping material. The reducing agent can remain on the semiconductor body after the diffusion process or it can be removed.

Referring now to the drawing, the single FIGURE shows a semiconductor body 1 made of silicon, in one surface of which centres of impurity are to be diffused locally. For this purpose, this surface is provided with a layer 2, which for example consists of an oxide or a nitride. The layer 2 is covered with a layer 3 of a reducing agent in that region in which no centres of impurity are to be diffused into the semiconductor body. For example, a metal such as titanium, zirconium or a semiconductor such as silicon may be used as a reducing agent. If diffusion takes place in an atmosphere which contains the doping material in the form of a compound, and a material is used as the reducing agent which reduces the impurity compound to elemental form, then the doping material is capable of penetrating into the semiconductor body only in that region which is not covered by the reducing agent. In this way, the selectively doped regions 4 are formed in the semiconductor body 1 at the sides of the layer 3 of the reducing agent. The method of the invention is suitable, for example, for a gas diffusion in which heating takes place in an atmosphere which contains the oxide of the doping material. The elements boron and phosphorus may be used as doping materials, for example, which are always present as oxides in diffusion from an oxidising atmosphere.

While the layer 2 is permeable to the doping compounds, the reducing agent layer causes the layer 2 to be impermeable in that area in which the reducing agent is present. The impermeability is increased to a greater extent by the reducing agent than in the known planar method so that diffusion can take place for longer periods than usual or a thinner layer 2 can be used.

It will be understood that the above description of the present invention is susceptible to various modifications changes and adaptations.

What is claimed is:

1. A method of doping a semiconductor body by diffusion from the gaseous phase in which centres of impurity are diffused into a limited region of one side of the surface of a semiconductor body, characterized by coating the surface over its entire area with a layer through which the doping material is capable of diffusing; and providing this layer with a reducing agent at those points at which doping is not desired in the semiconductor body, said reducing agent reducing the doping material, from its form in the gaseous atmosphere to the elemental form.

2. A method as defined in claim 1, wherein said reducing agent is contained in said layer located on said semiconductor body.

3. A method as defined in claim 1, wherein said reducing agent is applied to said layer located on said semiconductor body.

4. A method as defined in claim 1, wherein the layer applied to the semiconductor body consists of an oxide or a nitride.

5. A method as defined in claim 1, wherein a metal is used as a reducing agent.

6. A method as defined in claim 1, wherein a semiconductor is used as a reducing agent.

7. A method as defined in claim 1, wherein the reducing agent is applied over the entire area of the layer located on the semiconductor body and is subsequently structured.

8. A method as defined in claim 1, and comprising diffusing the centres of impurity into said semiconductor body in an oxidising atmosphere.

9. A method as defined in claim 1, wherein boron is used as a doping material.

10. A method as defined in claim 1, wherein phosphorus is used as a doping material.

11. A method of doping a semiconductor body comprising the steps of coating a surface of said semiconductor body over its entire area with a layer through which doping material can diffuse, providing said layer with a reducing agent at those parts of said surface of said semiconductor at which doping is not required for reducing the doping material to its elemental form and applying a gaseous phase of the doping material to said surface of said semiconductor body.

* * * * *